United States Patent [19]

Huson

[11] Patent Number: 4,822,772

[45] Date of Patent: Apr. 18, 1989

[54] ELECTROMAGNET AND METHOD OF FORMING SAME

[75] Inventor: Frederick R. Huson, The Woodlands, Tex.

[73] Assignee: Houston Area Research Center, The Woodlands, Tex.

[21] Appl. No.: 85,546

[22] Filed: Aug. 14, 1987

[51] Int. Cl.$^4$ ............................................. H01F 7/22
[52] U.S. Cl. ....................................... 505/1; 335/216; 335/304; 324/320
[58] Field of Search ....................... 335/299, 301, 216; 324/318, 319, 320; 505/1

[56] References Cited

U.S. PATENT DOCUMENTS

| | | | |
|---|---|---|---|
| 3,331,041 | 7/1967 | Bogner | 335/216 |
| 3,378,691 | 4/1968 | Swartz | 307/216 X |
| 4,490,675 | 12/1984 | Knuettiel et al. | 324/319 |
| 4,587,490 | 5/1986 | Muller et al. | 324/320 |
| 4,590,428 | 5/1986 | Muller et al. | 324/320 |
| 4,590,452 | 5/1986 | Ries et al. | 335/301 |
| 4,595,899 | 6/1986 | Smith et al. | 335/216 |
| 4,612,505 | 9/1986 | Ziilstra | 324/318 |
| 4,646,045 | 2/1987 | Chari et al. | 335/301 |
| 4,673,881 | 6/1987 | Ries et al. | 324/318 |
| 4,721,934 | 1/1988 | Stacy | 335/216 X |
| 4,725,781 | 2/1988 | Roschmann | 335/301 X |

OTHER PUBLICATIONS

Report No. 384-21—Superferric Supercollider Reference Design Texas Accelerator Center, Mar. 21, 1984.

Primary Examiner—George Harris
Attorney, Agent, or Firm—Vinson & Elkins

[57] ABSTRACT

A unitary superconducting electromagnetic structure (10) and method of forming same for use particularly at magnetic intensities greater than the magnetic saturation of iron and including an inner body (12) containing a coil pack (40) and an outer magnetic iron body (16) about the inner body (12) in concentric relation thereto. The outer body (16) has an end assembly (18) adjacent each end of the inner body (16) and the outer iron body (16) increases the magnetic field intensity at intensities substantially above the saturation of the magnetic iron in the outer body (16).

The design of the electromagnetic structure (10) is based on a computer program which utilizes accurate information concerning the mechanical, thermal, electrical and magnetic properties of the materials proposed for the electromagnet including particularly the thermal and magnetic properties of the iron for predicting precisely the magnetic permeability of the iron at all values of the magnetic field.

20 Claims, 6 Drawing Sheets

ELECTROMAGNET AND METHOD OF FORMING SAME

BACKGROUND OF THE INVENTION

This invention relates to a unitary superconducting electromagnet and method of forming same, and more particularly to such a unitary superconducting electromagnet and method which utilizes superconducting coils and an outer ferromagnetic body about the coils in obtaining a desired shape and intensity of the magnetic field.

Heretofore, it has been recognized that magnetic iron saturates at a magnetic field intensity of around one and one-half (1-½) Tesla and this has tended to restrict the operating range of conventional electromagnets. While higher magnetic fields have been utilized in conventional magnets, it has been very difficult to obtain a precision magnetic field having a uniformity or homogeneity of at least one (1) part per million. Also, such precision magnetic fields require substantial electrical power thereby resulting in high operating costs.

A superconducting magnet which utilizes superconducting coils substantially decreases the power requirements and permits much larger current densities thus reducing the amount of conductor material required for a specific predetermined current. Some superconducting magnets have used magnetic iron for a shield for the magnetic field but these shielded magnets have been limited to non-precision magnetic fields having a magnetic field intensity not substantially greater than the magnetic saturation of the iron which is around 1.5 Tesla.

Many present uses of superconducting electromagnets require a very high degree of magnetic field uniformity or homogeneity such as at least around one (1) part per million to around one (1) part per one hundred million. Such a uniformity can be obtained only with a magnetic field having a precise shape and intensity. Heretofore, only current has been used to obtain such a magnetic field uniformity.

Magnetic iron shields have been used heretofore for magnetic fields having an intensity not substantially greater than the magnetic saturation of iron, such as in U.S. Pat. No. 4,646,045, dated Feb. 24, 1987 which shows nuclear magnetic resonance (NMR) magnets in medical apparatus in order to minimize or eliminate any magnetic fringe or stray field which could interfere with adjacent equipment operation. A separate shield was utilized in U.S. Pat. No. 4,646,045 with a minimum amount of ferromagnetic material in order to minimize the effect of the shield on the field homogeneity and there was no suggestion of having such a shield effective at magnetic intensities greater than the magnetic saturation of the magnetic iron in the shield, and particularly to increase the magnetic field intensity. At higher magnetic fields above the saturation of magnetic iron, it has been common to provide a magnetic iron shield at a substantial distance from the coils, such as in the walls of a room containing the magnet.

A magnetic iron shield provides a part of the closed magnetic path and affects the shape and intensity of the magnetic field. Thus, it is necessary that the superconducting coils and shield be accurately positioned in relation to each other and to the magnetic field so that the desired shape and intensity of the magnetic field is obtained. Heretofore, such a superconducting electromagnet has not been provided in which the positioning of the coils and ferromagnetic shield in relation to each other and in relation to the magnetic field could be accurately predetermined so that a magnetic field uniformity of at least around one part per million is obtained, particularly when utilized in a magnetic field having an intensity substantially greater than the magnetic saturation of the iron.

SUMMARY OF THE INVENTION

This invention is particularly directed to a unitary electromagnet and method of forming same in which a unitary electromagnetic structure has an outer ferromagnetic body positioned accurately and precisely relative to an inner body containing superconducting coils to obtain in an efficient manner the desired shape and intensity of the magnetic field for maximum uniformity of at least around one part per million at a field intensity greater than the magnetic saturation of the outer ferromagnetic body. At least two (2) coils are provided within the inner body and the wire is precisely wound on the core of each coil under a predetermined tension dependent on the properties and dimensioning of the wire. The use of at least two (2) magnetic coils permits currents of different magnitude to aid in obtaining a desired shaping of the magnetic field. In order to obtain the precise positioning of the coils and outer magnetic iron body in relation to each other and to the magnetic field, precise adjusting means are provided between the coils and outer body and access to such adjusting means must be provided.

In regard to the uniformity or homogeneity of the magnetic field, the unitary electromagnet structure having an outer ferromagnetic body obtains a magnetic field uniformity of at least around one (1) part per million within a sphere of about one-quarter (¼) of the diameter or transverse dimension of the coil aperture or opening, which is suitable for use with NMR magnets. When such unitary electromagnets are utilized in spectroscopy, a uniformity of the magnetic field of one part in one hundred million is required within a sphere of a few centimeters, such as one (1) to three (3) centimeters, of the diameter of the coil opening.

The outer ferromagnetic body of the unitary electromagnet adjacent the superconducting coils increases the intensity of the magnetic field as much as twenty (20) percent or more and this is accomplished only by an accurate calculation of the parameters of the magnetic field and the relative locations of the inner and outer bodies in relation to the coils and the magnetic field. The outer ferromagnetic body distributes the magnetic field flux in a smooth uniform manner at magnetic field intensities substantially above the magnetic saturation of magnetic iron as high as around ten (10) Tesla. Thus, the saturation of the magnetic iron in the outer body enhances the uniform distribution of flux.

In order to obtain such a high quality magnetic field homogeneity or uniformity of at least around one part per million, a very precise method or series of steps is involved in the design of the unitary electromagnetic structure. First, the volume, shape, and intensity of the magnetic field for the unitary superconducting electromagnetic structure are established and an initial design is created to satisfy these requirements in addition to providing some means for access to the magnetic field in order to place equipment and samples therein or to receive patients or animals for testing or treatment. Next, the inner body containing the coils and the outer ferromagnetic body are positioned in relation to each other and to the magnetic field so that a desired effect on the intensity and shape of the magnetic field may be obtained with the precise adjustment of the inner body in relation to the outer body.

An initial design is established based on (1) computer programs using (a) parameters of the volume, shape, and intensity of the desired magnetic field; and (b) accurate information concerning the mechanical, thermal, electrical, and magnetic properties of the materials proposed for the unitary electromagnetic structure, including particularly the thermal and magnetic properties of the iron for predicting precisely the permeability of the iron at all values of the magnetic field; (2) appropriate engineering techniques to obtain the precise positioning of the components of the magnet including particularly the positioning of the coils and the outer ferromagnetic body in relation to each other and to the magnetic field; and (3) utilization of appropriate electromagnetic equations for achieving a practical, economical, engineering design. The computer programs may incorporate, if desired, the appropriate engineering techniques and electromagnet equations set forth under items (2) and (3) above or these items may be employed separately from the computer programming in obtaining the initial design. Then, the prototype unitary superconducting electromagnetic structure is manufactured based on the results and calculations obtained.

It is pointed out that even with a magnetic field intensity above the magnetic saturation of the outer ferromagnetic body, such as four (4) Tesla, for example, that the magnetic iron increases the intensity of the magnetic field at least around ten (10) percent and as much as around twenty (20) percent or more due to the precise location of the magnetic iron with respect to the magnetic field and the coils. The outer magnetic iron body absorbs and redirects the magnetic fringe field to provide such an increase in the magnetic intensity. The accurate and precise positioning of the outer magnetic iron body relative to the inner body containing the coils within a tolerance of around one mil (0.001 inch) also results in the high degree of uniformity of the field of at least around one (1) part per million.

Additionally, in order to obtain such a high precision magnetic field, the coils are wound within a precise tolerance in all directions and this is accomplished with a predetermined tensioning of the wire forming the coils. The electromagnet operates in a persistent current mode in which a superconducting switch switches from a charging power supply to the persistent mode. It may also be necessary to provide adequate cooling for the superconducting coils and helium or nitrogen may be employed for such cooling so that the superconducting members are cooled below their critical temperature to cause such members to become superconducting.

It is an object of the present invention to provide a unitary electromagnetic structure having an outer ferromagnetic body about an inner relatively movable body containing the magnetic coils with the outer body enhancing the uniform distribution of flux at magnetic field intensities substantially above the saturation of iron in the outer body as high as around ten (10) Tesla.

It is a further object of this invention to provide a unitary superconducting electromagnetic structure having an outer ferromagnetic iron body about the superconducting coils and the method of forming such a unitary superconducting electromagnet in which the magnetic field has a uniformity of at least one (1) part per million and as high as one (1) part per one hundred million.

An additional object of the invention is to provide such a superconducting electromagnet and method in which the outer magnetic iron body increases the magnetic intensity of the magnetic field at least around ten (10) percent and as much as twenty (20) percent or more.

Another object of this invention is to provide a method for manufacture of such a unitary superconducting electromagnet in which a computer program and software are utilized which include accurate information concerning the mechanical, thermal, electrical, and magnetic properties of the materials used in the magnet, as well as appropriate electromagnetic equations and engineering techniques for positioning the coils and outer magnetic iron body in relation to each other within a tolerance of one (1) mil to obtain the desired intensity and shape of the magnetic field for maximum uniformity of the field.

Other objects, features and advantages of this invention will become more apparent after referring to the following specification and drawings.

DETAILED DESCRIPTION OF THE INVENTION

Figure 1:
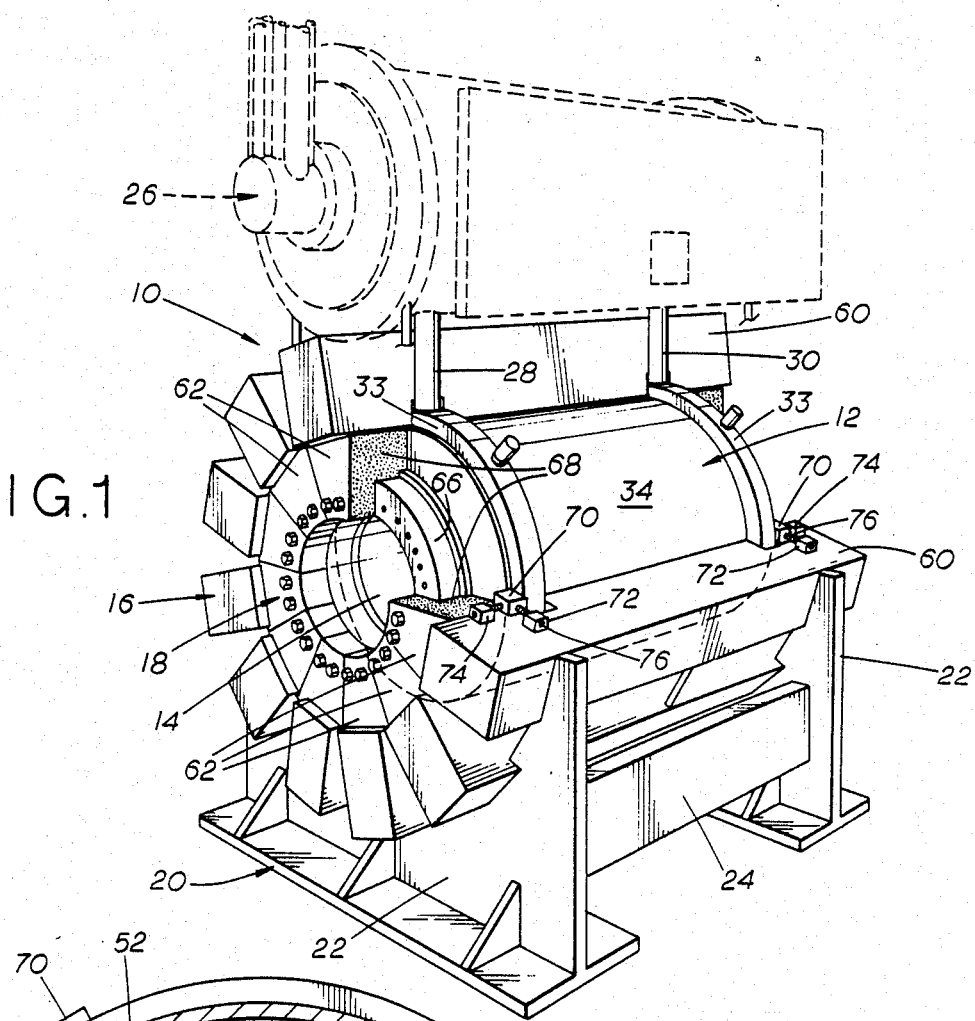
FIG. 1 is a perspective with certain parts broken away of an example of a unitary superconducting electromagnet in accordance with the present invention having an inner body with a central bore therethrough and an outer ferromagnetic body about the superconducting coils of the inner body and means to position accurately the outer body relative to the coils of the inner body.

An embodiment of a unitary superconducting electromagnet or electromagnetic structure in accordance with the present invention is shown in FIGS. 1-5 of the drawings and is generally indicated at 10. Unitary electromagnet structure 10 is particularly adapted for use with nuclear magnetic resonance (NMR) equipment for medical apparatus. However, it is to be understood that the present invention may be utilized in many applications, such as in accelerators, particle beams, spectroscopy, and the like.

Unitary electromagnet structure 10 includes an inner cylindrical body or housing generally indicated at 12 and being of a toroidal shape having a central bore 14 therethrough and mounted within an outer magnetic iron body indicated generally at 16. Outer magnetic iron body 16 includes opposed end plate assemblies 16 between which inner body 12 is mounted. Bore 14 may be of a size sufficient to receive the body of a patient in the event the electromagnetic structure 10 is used with NMR imaging.

A cradle type base support generally indicated at 20 includes opposed end support cradle members 22 formed of a non-magnetic material with longitudinally extending beams 24 secured between end support members 22. Mounted on the upper surface of magnetic iron body 16 is cryogenic cooling means shown in broken lines generally at 26 including a cooling medium, such as helium or nitrogen, for cooling the superconducting electromagnet 10 to the superconducting temperature of the materials used in the electromagnet. An inlet is shown at 28 for providing the cooling fluid about a fluid passageway for cooling the electromagnet and an outlet is shown at 30 for receiving the cooling fluid after cooling of the superconducting materials. Suitable cryogenic cooling means for providing such a cooling medium is well known in the art.

Figure 3:
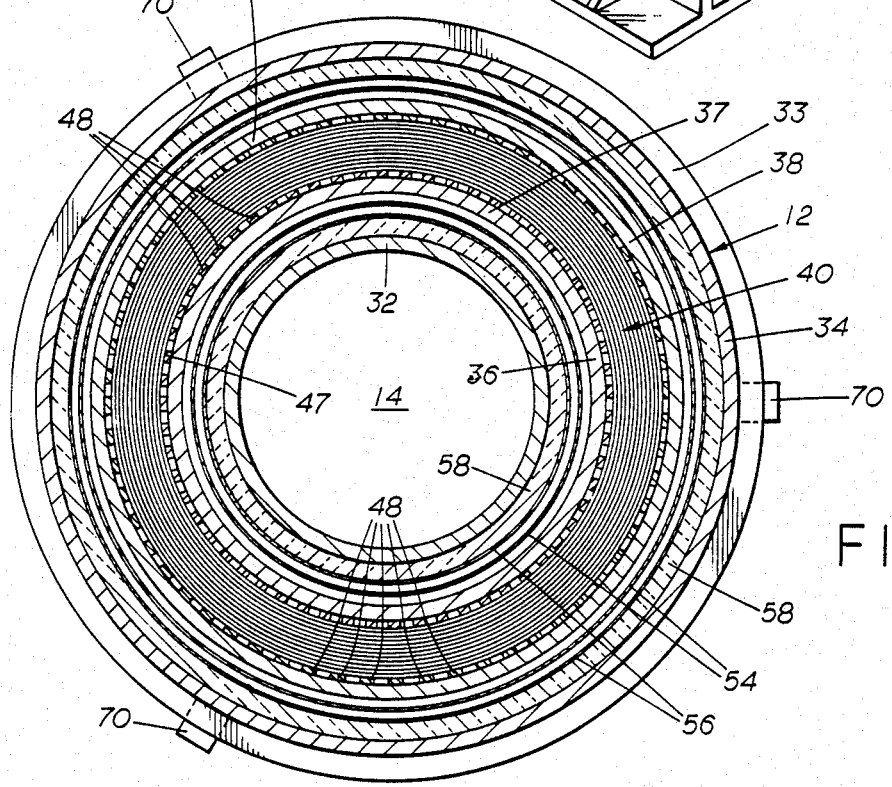
FIG. 3 is a transverse cross section of the generally cylindrical inner body for the coils of the electromagnet illustrating particularly the arrangement of heat shields and means for the flow of a cooling medium, such as helium, for cooling the superconducting materials.
Figure 2:
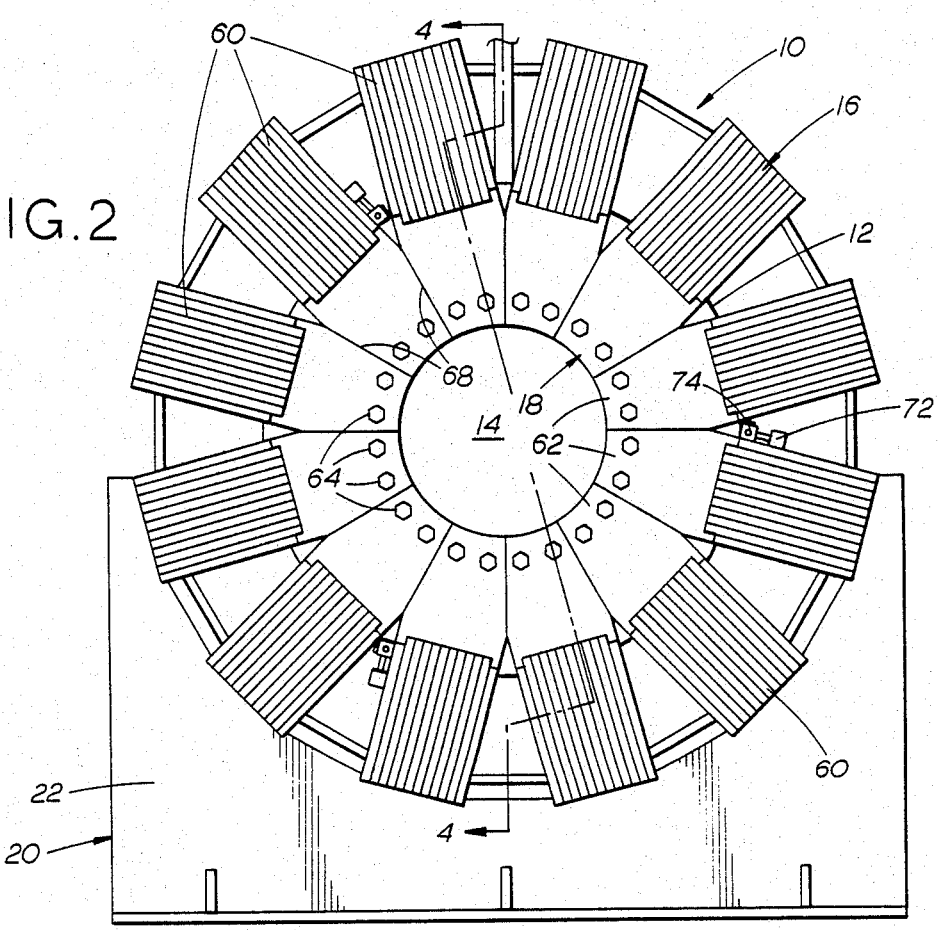
FIG. 2 is an end elevation of the electromagnet shown in FIG. 1 showing the outer ferromagnetic body adjacent the coils formed in a plurality of segments and supported on a cradle type base support.
Figure 4:
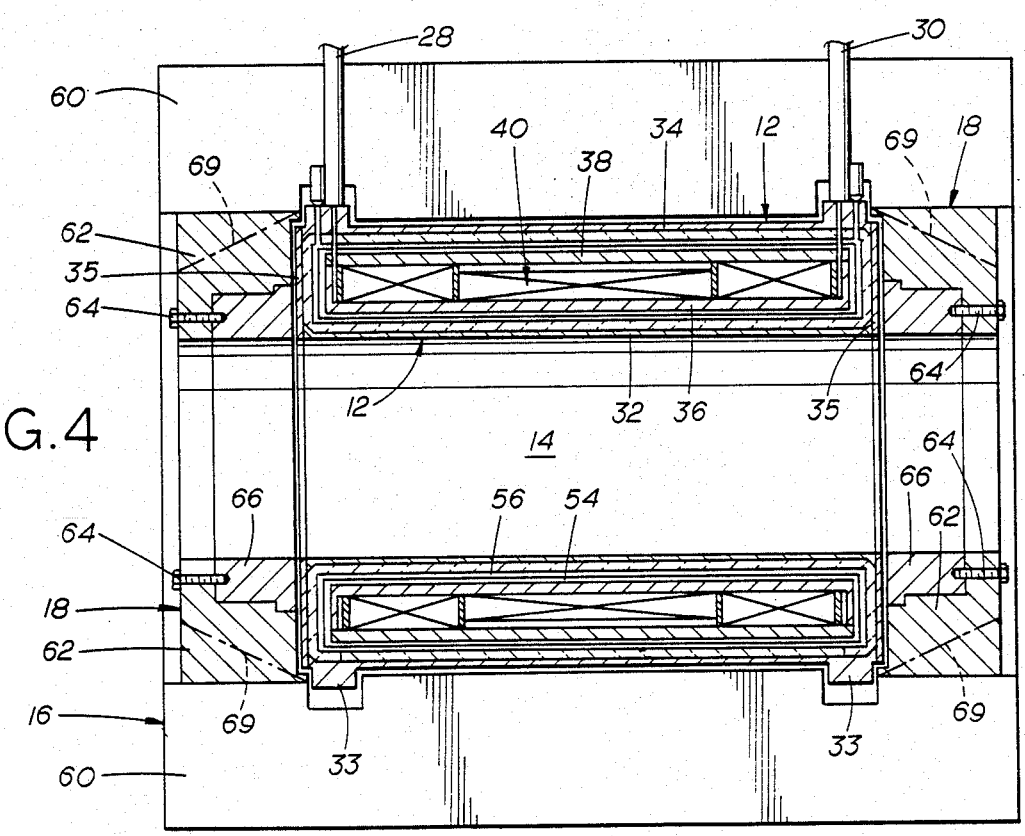
FIG. 4 is a longitudinal sectional view taken generally along line 4—4 of FIG. 2 and showing the inner cylindrical body for the coils mounted within the outer magnetic iron body about the inner body.
Figure 5:
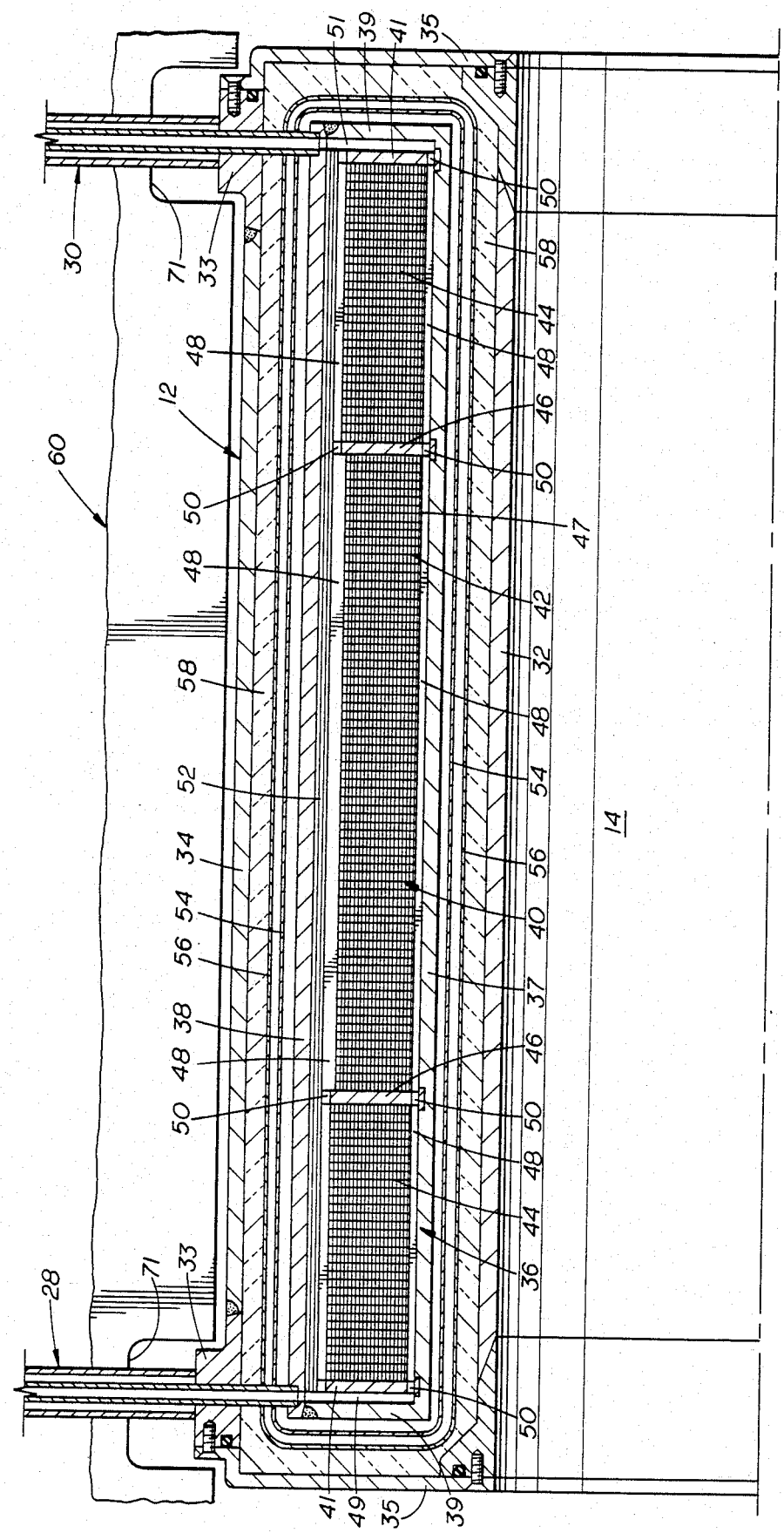
FIG. 5 is an enlarged longitudinal section of a fragment of FIG. 4 showing specifically the arrangement of the magnetic coils within the inner cylindrical body.

As shown in FIGS. 3-5, inner cylindrical body 12 has an inner shell 32 which defines bore 14 and an outer concentric shell 34. An end ring 33 is secured to outer shell 34 at each end thereof. End plates 35 connect shells 32 and 34 at their ends to form a vacuum jacket for the superconducting coils. Forming an enclosed housing 36 for the superconducting coils are intermediate spaced shells 37 and 38 with closed ends 39 and providing an annular space therebetween receiving the superconducting coil assembly or coil pack indicated generally at 40 and between end plates 41. Coil pack 40 includes a main center coil 42 and an end coil 44 adjacent each end of center coil 42 separated by annular spacer plates 46 formed of a non-magnetic material. The wire from which coils 42 and 44 is formed is wound on a core or bobbin 47 supporting the wire within an accuracy of one (1) mil, and while tensioned under a predetermined tension dependent on the properties and size of the wire material. The wire preferably has a rectangular cross section having transverse dimensions of fifty (50) mils by one hundred (100) mils, for example, which includes the superconducting material. The wire is tensioned under a predetermined tension of around one hundred (100) pounds while being wound onto the associated supporting core 47 and the tension is gradually and progressively decreased during winding in accordance with precise calculations based on the type and size of materials utilized, the thermal and mechanical properties of the materials, and the position of the wire on the core. The use of a plurality of magnetic coils permits currents of different magnitudes to be utilized thereby to aid in obtaining a desired shaping and intensity of the magnetic field.

The core or bobbin 47 is formed of a plurality of circumferentially spaced strips or slats 48 of around one-half ($\frac{1}{2}$) inch in width positioned about both the inner and outer surfaces of coils 42 and 44 and forming flow passages between strips 48 to permit the flow of cooling fluid along coils 42 and 44. A layer of stainless steel banding 52 is wrapped around the outer strips 48 as shown in FIG. 5. As shown particularly in FIG. 5, helium from inlet 28 flows to a fluid passage 49 adjacent coil pack 40 and then through openings 50 in end plates 41 and spacer plates 46 along coil pack 40 and the spacings between strips 48 to fluid passage 51 for return to the cryogenic cooling means 26 through outlet 30. An inner heat shield shown generally at 54 of a metallic material for a temperature of twenty (20) degrees Kelvin and segmented to minimize eddy currents is formed about housing 36 for enclosing coil pack 40. An outer heat shield 56 extends about inner heat shield 54 in spaced relation thereto and is formed of a metallic material for a temperature of eighty (80) degrees Kelvin and is segmented to minimize eddy currents. A super insulating material is provided in the space shown at 58 between outer heat shield 56 and the vacuum jacket formed by inner and outer shells 32, 34. As well known, means (not shown) are provided for exerting a vacuum in the space between shells 32, 34, and for providing a cooling fluid for cooling heat shields 54, 56.

Outer magnetic iron body 16 includes a plurality of longitudinally extending sections indicated at 60. Each section 60 has a plurality of plates secured to each other and forming laminations extending between end plate assemblies 18. Each section 60 has secured adjacent each end thereof a radially extending segment 62 secured by bolts 64 to an end ring 66 thereby to form the end plate assembly indicated at 18 positioned adjacent each end of inner cylindrical body 12. The contacting sides 68 of adjacent segments 62 have a layer of insulating material thereon, such as insulating paint. By having segments 62 insulated from each other, this breaks up the paths of the eddy current by increasing the resistance to such paths. Also, if desired, segments 62 may be formed of a plurality of connected plates which break up the paths of the eddy currents.

It is noted that end plate assemblies 18 particularly as shown in FIG. 4 are positioned closely adjacent the end of inner body 12 and coil pack 40, and have inner and outer diameters generally corresponding to those of inner body 12. Outer body 16 provides a closed magnetic path extending from coil pack 40 along end assemblies 18 and connecting sections 60 of outer iron body 16. The portions of end assemblies 18 radially inward of line 69 shown in FIG. 4 when positioned closely adjacent coil pack 40 have a magnetic intensity greater than the saturation of iron or above around 1.5 or 1.7 Tesla while the remainder of outer body 16 including longitudinally extending sections 60 having a magnetic intensity at the saturation level. For a four (4) Tesla magnet, for example, the magnetic intensity of end assemblies 18 radially inward of line 69 would vary from around 1.5 Tesla to around four (4) Tesla. However, by precise positioning of outer body 16 relative to inner body 12, end assemblies 18 which form pole faces aid in increasing the intensity of the magnetic field. For this purpose, accurate information concerning the thermal and magnetic properties of the iron in end assemblies 18 is required for predicting precisely the permeability of the iron at all values of the magnetic field. Up to around 2.5 Tesla, the permeability is measured in accordance with well known techniques. Above 2.5 Tesla the measured values of the permeability of the iron in outer body 16 and end assemblies 18 are used to obtain the magnetization saturation, and these calculations are then employed to obtain the permeability from an interpolation of the Frolich-Kennelly formula as set forth in the publication entitled "The Interpolation of Magnetization Tables", dated 1986, authored by Sergio Pissanetzky and obtainable from the Texas Accelerator Center, 2319 Timberloch Place, The Woodlands, Tex. 77389 U.S.A. Thus, a magnetization table for a specific iron material, such as U. S. 1008 steel, for example, may be established.

In order to obtain the precise positioning of coils 42 and 44 with respect to outer body 16 about the inner cylindrical body 12 containing coils 42, 44 in relation to each other and in relation to the magnetic field, a precise adjustment of inner body 12 both radially and longitudinally relative to outer magnetic iron body 16 must be provided. For this purpose and referring particularly to FIG. 1, adjusting blocks 70 are secured to the outer surface of ring 33 on outer shell 34 of inner body 12 at spaced intervals of one hundred twenty (120) degrees about the outer circumference of outer shell 34 and adjacent each end thereof to provide three (3) longitudinally aligned pairs of adjusting blocks 70 which fit within suitable slots 71 provided in adjacent sections 60 of outer magnetic iron body 16. Mounted on an outer lamination of the adjacent longitudinal extending section 60 for each of blocks 70 is a radial block 72 and an axial block 74. Blocks 72 and 74 contain adjustable set screws 76 accessible to workmen through the space between sections 60. Set screws 76 have their inner ends in contact with blocks 70 for moving inner cylindrical body 12 within radial and axial distances of one (1) mil relative to outer magnetic iron body 16 through suitable adjustment of screws 76 on blocks 72 and 74. By accurate positioning of inner cylindrical body 12 relative to outer magnetic iron body 16, the precision of the magnetic field to at least one (1) part per million is obtained and this is accomplished only by accurate calculation of the parameters of the magnetic field along with accurate positioning.

It is noted that a high quality magnetic field homogeneity or uniformity of at least one (1) part per million is required for many applications of the unitary superconducting electromagnet and some applications, such as spectroscopy require a uniformity in the magnetic field of one (1) part per one hundred million. In order to obtain such a high quality magnetic field, a very precise method or series of steps is involved in the design of the electromagnet. First, the volume, shape and intensity of the magnetic field for the superconducting electromagnet are established and an initial design is created for maximizing field intensity with a minimal coil size and including some means such as a central bore for access to the magnetic field in order to place objects therein for testing or treatment. The initial design includes positioning the superconducting coils and outer ferromagnetic body in relation to each other and to the magnetic field so that the desired effect on the intensity and shape of the magnetic field may be obtained from radial and axial adjustment of the coils and outer magnetic iron body in relation to each other within a tolerance of one (1) mil.

Further, the initial design is established based on one (1) computer programs using (a) parameters of the volume, shape, and intensity of the desired magnetic field; and (b) accurate information concerning the mechanical, thermal, electrical, and magnetic properties of the materials proposed for the unitary electromagnet, including particularly the thermal and magnetic properties of the iron for predicting precisely the permeability of the iron at all values of the magnetic field; (2) appropriate engineering techniques to obtain the precise positioning of the components of the magnet including particularly the positioning of the inner body coils and the magnetic iron body in relation to each other and to the magnetic field; and (3) utilization of appropriate electromagnetic equations for achieving a practical, economical, engineering design. The computer programs may incorporate, if desired, the appropriate engineering techniques and electromagnet equations set forth under items (2) and (3) above or these items may be employed separately from the computer programming in obtaining the initial design. A computer program which has been utilized satisfactorily in the design of the present invention is referred to as the "Magnus" program and is set forth in the following publications authored by Sergio Pissanetzky and obtainable from Texas Accelerator Center, 2319 Timberloch Place, The Woodlands, Tex. 77380 U.S.A.:

(1) Manuscript identified as BNL (Brookhaven National Laboratory) 28416 AMD 867 entitled "Magnus - Computer-Aided Design of Electromagnets".

(2) Publication dated 1986 entitled "The New Version of the Finite Element 3D Magnetostatics Program Magnus"

Another computer program which has been found to be satisfactory for utilization with the present invention is the "Poisson/Superfish" program as set forth in Report No. LA-UR-87-115 entitled "User's Guide for the Poisson/Superfish Group of Codes, issued January 1987, authored by M. T. Menzel, H. K. Stokes and obtainable from Los Alamos National Laboratory, Los Alamos, N. Mex. 87545 U.S.A. Then, after the establishment of the initial design based on the results and calculations obtained, the prototype superconducting electromagnet is manufactured.

It is pointed out that with a magnetic field intensity above the magnetic saturation of the outer ferromagnetic body, such as four (4) Tesla, for example, the magnetic iron of the outer body increases the intensity of the magnetic field at least around ten (10) percent and as much as around twenty (20) percent or more due to the precise location of the magnetic iron with respect to the magnetic field and the coils. The outer magnetic iron body absorbs and directs the magnetic fringe field to provide such an increase in the magnetic intensity. This is accomplished by a distribution of the flux in a uniform manner and at magnetic field intensities substantially above the magnetic saturation of the magnetic iron as high as around ten (10) Tesla. The accurate and precise positioning of the outer magnetic iron body relative to the coils within a tolerance of one (1) mil also results in the high degree of uniformity of the field of at least around one (1) part per million.

Figure 6:
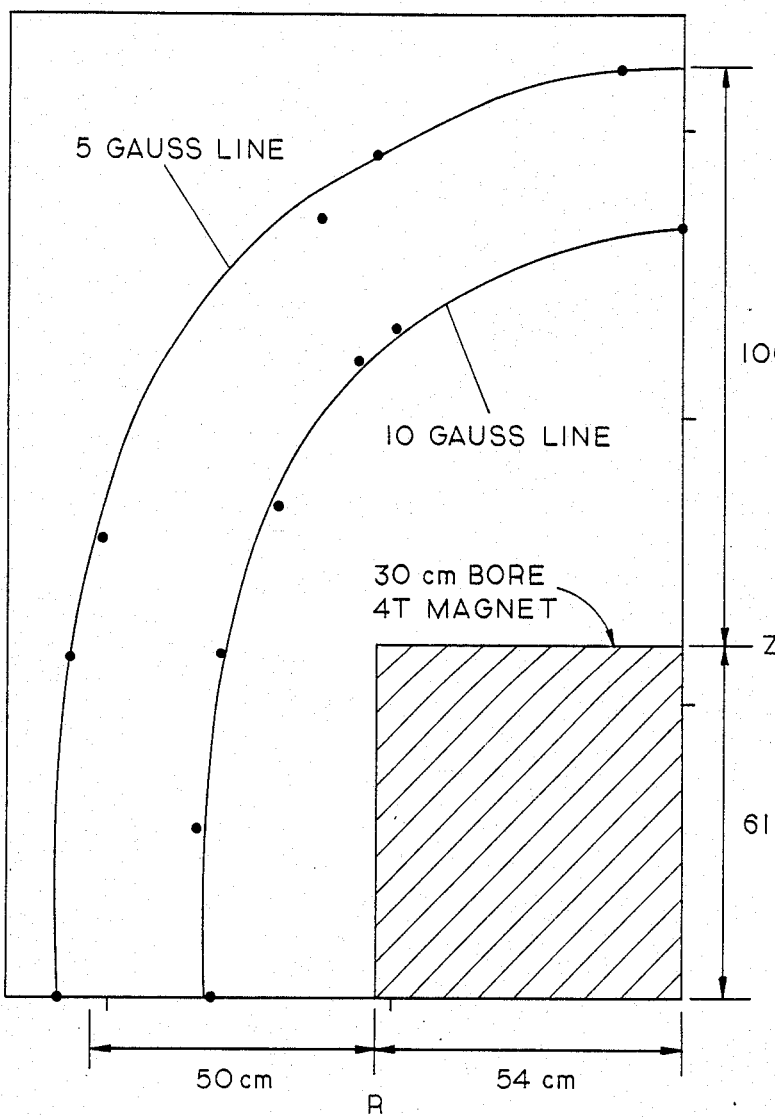
FIG. 6 is a graph of a quadrant of the magnetic fringe field at a magnetic intensity of four Tesla.

FIGS. 6-9 are directed to graphs which illustrate the results obtained for a superconducting unitary electromagnet constructed in accordance with the foregoing method and as shown and described in the drawings. Referring to FIG. 6, a graph is illustrated showing a magnetic fringe field at four (4) Tesla. The R direction extends radially from the center of central bore 14 which defines the working volume of electromagnet 10 and the C direction in centimeters is along the longitudinal axis defined by bore 14. A five (5) gauss line and a ten (10) gauss line are shown extending outwardly from the bore of electromagnet 10.

Figure 7:
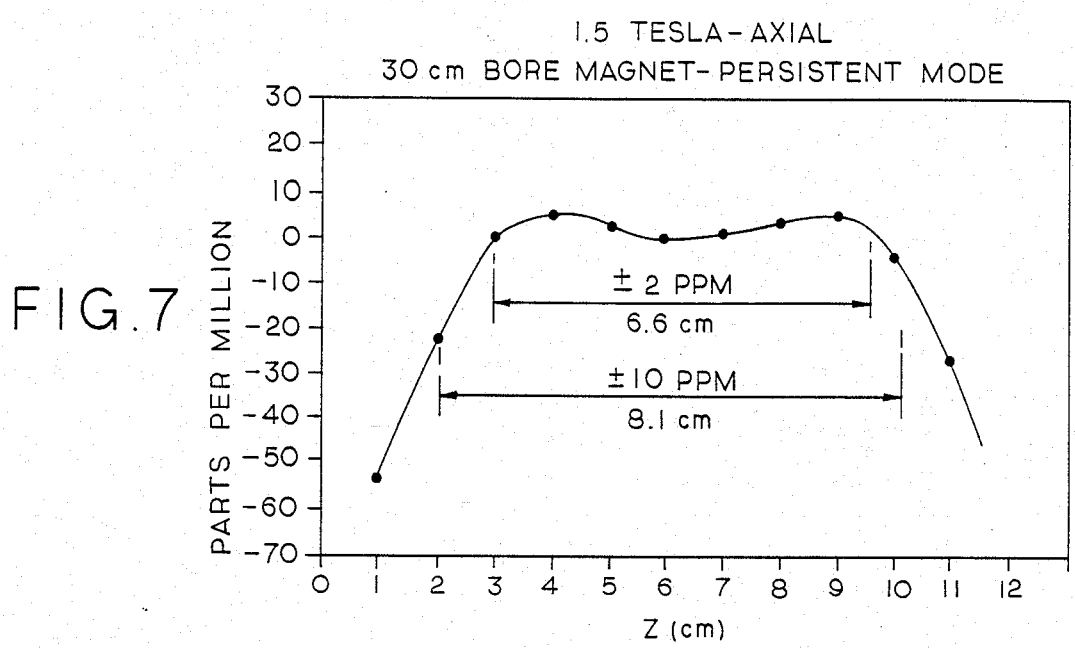
FIG. 7 is a graph showing a field uniformity for a 1.5 Tesla magnetic field with an axial dimension for the electromagnet and utilizing an outer magnetic iron body.

FIG. 7 shows the uniformity along the Z axis or longitudinal centerline of bore 14 for an intensity of 1.5 Tesla in a persistent mode. It is noted that a very high uniformity is obtained of ±ten (10) ppm within 8.1 cm without the use of any trim coils.

Figure 8:
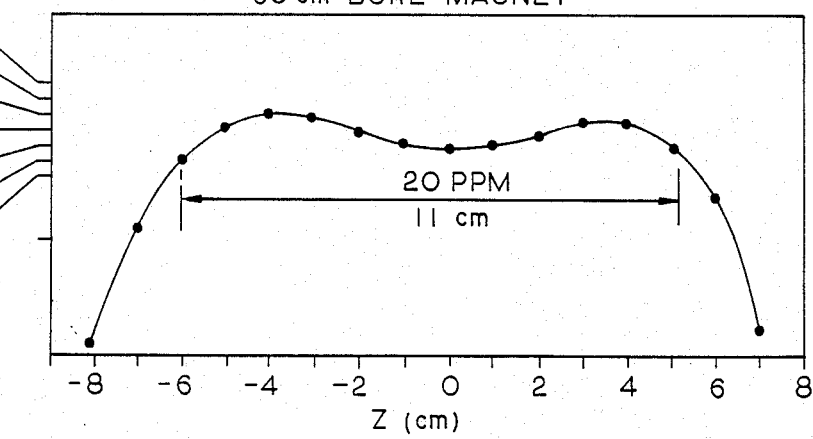
FIG. 8 is a graph similar to the graph of FIG. 7 but showing field uniformity for a four (4) Tesla magnetic field.

Referring to FIG. 8, a graph is shown illustrating the homogeneity for a magnetic field intensity at four (4) Tesla in an axial direction along the longitudinal centerline of bore 14. It is noted a uniformity of twenty (20) ppm is obtained within eleven (11) cm without the use of any trim coils or trim fields.

Figure 9:
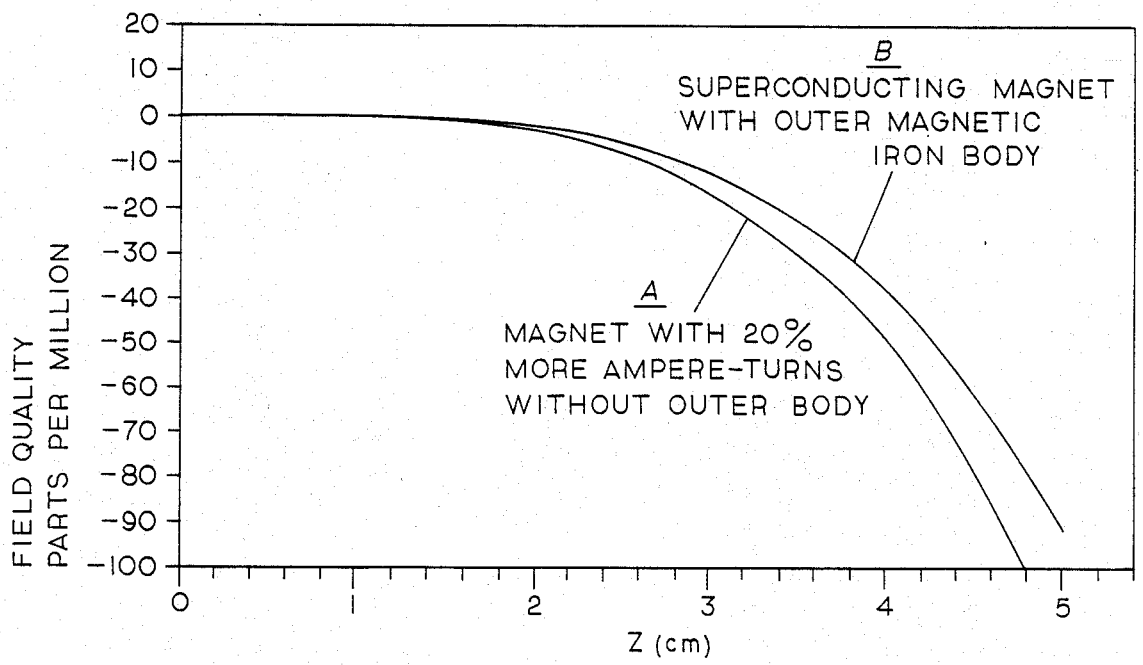
FIG. 9 is a graph comparing the magnetic field intensity of the unitary superconducting electromagnet of this invention in which an outer magnetic iron body positioned about an inner body containing the coils, with an electromagnet having a twenty percent increase in the ampere turns of the coils, without an outer magnetic iron body.

Referring now to FIG. 9, this graph shows the increase in magnetic field intensity of over twenty (20) percent with the utilization of a magnetic iron body about the superconducting coils with the increase in intensity being generally uniform for field intensities from one-half ($\frac{1}{2}$) Tesla to four (4) Tesla. Curve A illustrates an electromagnet in which magnetic coils are utilized without a magnetic iron body with the coils being wound with twenty (20) percent additional ampere turns. Curve B indicates the field quality obtained with a unitary superconducting electromagnetic structure in accordance with the present invention in which an magnetic iron body about the coils is utilized. Thus, it is believed apparent that the utilization of a unitary superconducting electromagnet constructed in accordance with the method set forth, and with the coils being positioned precisely and accurately in relation to an adjacent magnetic iron body, results in an increase of the magnetic field at least around ten (10) percent and as high as twenty (20) percent or more. The outer magnetic body enhances the uniform distribution of flux at magnetic field intensities substantially above the saturation of iron. Further, a very high precision field is obtained thereby with a uniformity of at least one (1) part per million and as high as one (1) part per one hundred million. Such a high precision field is illustrated in FIGS. 7 and 8.

Figure 10:
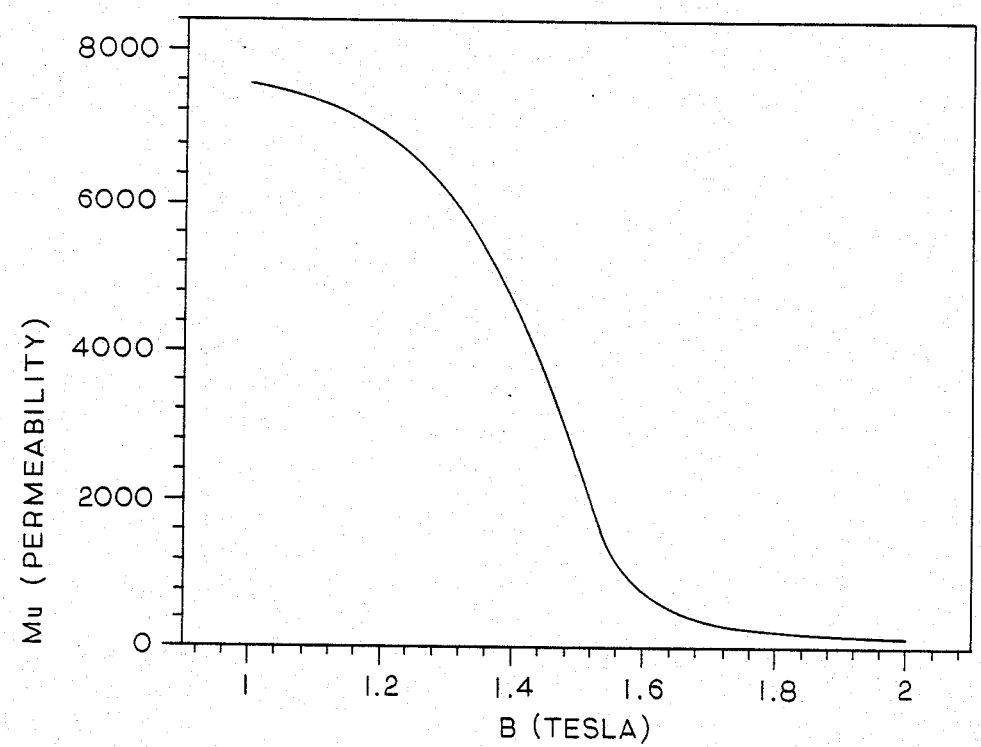
FIG. 10 is a graph showing the permeability of a specific iron material from a magnetic intensity of one (1) Tesla to two (2) Tesla.
Figure 11:
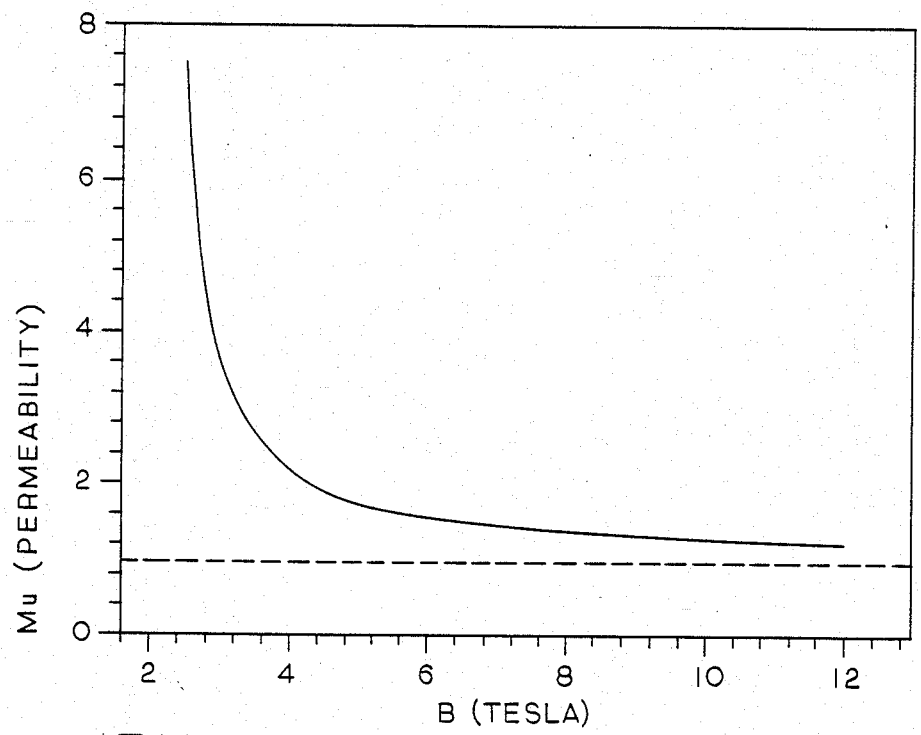
FIG. 11 is a graph showing the permeability of the iron material illustrated in FIG. 10 from a magnetic intensity of two (2) Tesla to twelve (12) Tesla.

Referring to FIGS. 10 and 11, the permeability of a specific iron material, ASTM U.S. 1008 steel, utilized in outer body 16 is illustrated graphically. FIG. 10 shows permeability for a magnetic intensity to two (2) Tesla and FIG. 11 shows the permeability for a magnetic intensity from two (2) Tesla to twelve (12) Tesla. It is noted from FIG. 11 that the permeability of air is one and the permeability from four (4) Tesla to twelve (12) Tesla is between one and two. The permeability was calculated in accordance with the aforementioned publication entitled "The Interpolation of Magnetization Tables".

While the present invention is particularly adapted for use with magnetic fields having an intensity greater than the magnetic saturation of iron, it is to be understood that the present invention may be utilized with magnetic field intensities less than the magnetic saturation of iron. Also, while the embodiment of the electromagnet illustrated herein utilizes means for adjusting the position of the coils relative to the outer iron body after construction of the electromagnet, it is to be understood that some embodiments of this invention may have the coils and outer iron body fixed in relation to each other after construction thereby requiring a highly accurate positioning of such coils and outer iron body in the design being constructed or manufactured.

While preferred embodiments of the present invention have been illustrated in detail, it is apparent that modifications and adaptations of the preferred embodiments will occur to those skilled in the art. However, it is to be expressly understood that such modifications and adaptations are within the spirit and scope of the present invention as set forth in the following claims.

What is claimed is:

1. A method for manufacturing a unitary superconducting electromagnetic structure having an inner body containing at least two superconducting coils and an outer magnetic iron body about the inner body and associated magnetic field particularly adapted for use with a magnetic field having an intensity greater than that at which magnetic iron is saturated; said method comprising the following steps:

first establishing the volume, shape and intensity of the desired magnetic field for said unitary superconducting electromagnetic structure and providing means for access to said magnetic field for receiving objects to utilize the magnetic field; and positioning said inner body containing said coils and said outer magnetic iron body in relation to each other and in relation to the magnetic field so that said outer magnetic iron body enhances the uniform distribution of flux and increases the magnetic field intensity at magnetic field intensities substantially above saturation of the magnetic iron in said outer body.

2. A method for manufacturing a unitary superconducting electromagnetic structure having an inner body containing at least two superconducting coils and an outer magnetic iron body about the inner body and associated magnetic field particularly adapted for use with a magnetic field having an intensity greater than that at which magnetic iron is saturated; said method comprising the following steps:

first establishing the volume, shape and intensity of the desired magnetic field for said unitary superconducting electromagnetic structure and providing means for access to said magnetic field for receiving objects to utilize the magnetic field;

utilizing a computer program having accurate information concerning the thermal and magnetic properties of the materials used in the electromagnet and particularly a precise calculation of the permeability of the iron at all values of the magnetic field; and then positioning said inner body containing said coils and said outer magnetic iron body in relation to each other and in relation to the magnetic field so that said outer magnetic iron body enhances the uniform distribution of flux and increases the magnetic field intensity at magnetic field intensities substantially above saturation of the magnetic iron in said outer body.

3. A method for manufacturing a unitary superconducting electromagnetic structure having an inner generally cylindrical body with a central bore therethrough containing at least two superconducting coils and an outer magnetic iron body about the inner body in concentric relation thereto, the outer body including an end assembly closely adjacent each end of said inner body and having a bore corresponding to the central bore of said inner body; said method comprising the following steps:

first establishing the volume, shape and intensity of the desired magnetic field for said unitary superconducting electromagnetic structure;

utilizing a computer program having accurate information concerning the thermal and magnetic properties of the materials used in the electromagnet and particularly precise information of the permeability of the iron at all values of the magnetic field; and positioning said inner body containing said coils and said outer magnetic iron body including said end assemblies closely adjacent said coils and the magnetic field so that said outer magnetic iron body enhances the uniform distribution of a flux and increases the magnetic field intensity at magnetic field intensities substantially above saturation of the magnetic iron in said outer body.

4. A method for manufacturing a unitary superconducting electromagnetic structure having an inner body containing at least two superconducting coils and an outer magnetic iron body about the inner body and associated magnetic field particularly adapted for use with a magnetic field having an intensity greater than that at which magnetic iron is saturated; said method comprising the following steps:

first establishing the volume, shape and intensity of the desired magnetic field for said unitary superconducting electromagnetic structure and providing means for access to said magnetic field for receiving objects to utilize the magnetic field;

positioning said inner body containing said coils and said outer magnetic iron body in relation to each other and in relation to the magnetic field so that said outer magnetic iron body enhances the uniform distribution of a flux and increases the magnetic field intensity at magnetic field intensities substantially above saturation of the magnetic iron in said outer body;

further adjusting the position of the coils and magnetic iron structure in relation to each other within a precise tolerance to obtain the desired shape and maximum intensity of the magnetic field, the magnetic coils including at least two coils adapted to be utilized with different predetermined currents, each coil being formed by winding about a core while being tensioned a predetermined amount thereby to obtain a magnetic field uniformity of greater than one part per million.

5. A method for manufacturing a unitary superconducting electromagnetic structure having an inner body containing at least two superconducting coils and an outer magnetic iron body about the inner body and associated magnetic field particularly adapted for use with a magnetic field intensity greater than the magnetic saturation of iron; said method comprising the following steps:

first establishing the volume, shape and intensity of the desired magnetic field for said unitary superconducting electromagnetic structure and providing means for access to said magnetic field for receiving objects to utilize the magnetic field;

positioning said inner body containing said coils and said outer magnetic iron structure in relation to each other and in relation to the magnetic field so that said outer magnetic iron body enhances the uniform distribution of a flux and increases the magnetic field intensity at magnetic field intensity substantially above magnetic iron in said outer body;

utilizing a computer program which includes appropriate electromagnetic equations, appropriate engineering techniques for obtaining a precise positioning for the components of the electromagnet including particularly the coils and the magnetic iron structure, and accurate information concerning the mechanical, thermal, electrical, and magnetic properties of the materials used in the electromagnet including particularly the materials used in the coils and the magnetic iron structure, the results obtained from the computer program being utilized for providing an engineering design;

manufacturing the superconducting electromagnet in accord with the design based on the results and calculations obtained from the initial computer program; and further adjusting the position of the coils and outer magnetic iron body in relation to each other within a precise tolerance to obtain the desired shape and increased intensity of the magnetic field, the magnetic coils including at least two coils adapted to be utilized with different predetermined currents, each coil being formed by winding about a core while being tensioned a predetermined amount thereby to obtain a magnetic field uniformity of greater than around one part per million.

6. A method for manufacturing a unitary superconducting electromagnet having a magnet field uniformity of at least around one part per million and an outer magnetic iron body extending about the magnetic field and providing a closed magnetic path for containing the magnetic fringe field and increasing the intensity of the magnetic field, the electromagnet especially adapted for use in a magnetic field having an intensity of over 1.5 Tesla at which magnetic iron is saturated and further including at least two coils about the magnetic field adapted for utilization with different predetermined electrical currents; said method including the following steps:

first establishing the volume, shape and intensity of the desired magnetic field for said unitary superconducting electromagnetic structure and providing means for access to said magnetic field for receiving objects to utilize the magnetic field;

positioning said coils and outer magnetic iron body in relation to each other and in relation to the magnetic field so that said outer magnetic iron obtains a maximum effect on the intensity and shape of the magnetic field and results in an increase in the intensity of the magnetic field;

utilizing a computer program which includes appropriate electromagnetic equations, appropriate engineering techniques for obtaining a precise positioning for the components of the electromagnet including particularly the coils and said outer magnetic iron body, and accurate information concerning the mechanical, thermal, electrical, and magnetic properties of the materials used in the electromagnet including particularly the materials used in the coils and outer magnetic iron body, the results obtained from the computer program being utilized for providing an engineering design;

manufacturing the unitary superconducting electromagnet in accord with the design based on the results and calculations obtained from the initial computer program; and then further adjusting the position of the coils and outer magnetic iron body in relation to each other within a precise tolerance to obtain the desired shape and increased intensity of the magnetic field, the magnetic coils including at least two coils adapted to be utilized with different predetermined currents, each coil being formed by winding about a core while being tensioned a predetermined amount thereby to obtain a magnetic field uniformity of greater than around one part per million.

7. A unitary superconducting electromagnetic structure particularly adapted for use with magnetic field intensities greater than the magnetic saturation of iron and comprising:

an inner body having dimensions conforming generally to the magnetic field;

a first coil arranged in a pattern about the magnetic field and positioned generally symmetrically to said inner body;

a second coil arranged adjacent said first coil and positioned generally symmetrically to said inner body about the magnetic field, said coils being adapted for utilization with different predetermined electrical currents; and an outer magnetic iron body about said inner body and said magnetic field and aiding in providing a desired shape and intensity of the magnetic field, said magnetic iron body providing a closed magnetic path for containing and redirecting the magnetic field for increasing the intensity of the magnetic field at magnetic field intensities substantially above the saturation of the magnetic iron in said outer body.

8. A unitary superconducting electromagnetic structure particularly adapted for use with magnetic field intensities greater than the magnetic saturation of iron and comprising:

an inner body having dimensions conforming generally to the magnetic field and containing a plurality of coils arranged in a pattern about the magnetic field and positioned generally symmetrically to said body, said coils being formed of superconducting wire and adapted for utilization with different predetermined electrical currents;

an outer magnetic iron body extending about said inner body and said magnetic field and aiding in providing a desired shape and intensity of the magnetic field, said magnetic iron body providing a closed magnetic path for containing and redirecting the magnetic field for increasing the intensity of the magnetic field at magnetic field intensities substantially above the saturation of the magnetic iron in said outer body; and means mounting said inner body and said outer magnetic iron body for movement relative to each other so that the relative positioning of said outer magnetic iron body to said coils and said magnetic field may be adjusted within a precise tolerance for providing a magnetic field uniformity of at least around one part per million.

9. A unitary superconducting electromagnetic structure as set forth in claim 8 wherein said means mounting said inner body and said outer body for movement relative to each other includes adjustable blocks utilizing set screws positioned between said inner body and said outer body.

10. A superconducting electromagnetic structure having a magnetic field uniformity of at least around one part per million and particularly adapted for use in a magnetic field having an intensity of over 1.5 Tesla at which magnetic iron is saturated; said electromagnet comprising:

a body having dimensions conforming generally to the magnetic field and containing a plurality of coils arranged in a pattern about the magnetic field and adapted for utilization with different predetermined electrical currents;

an outer magnetic iron body about said inner body and said magnetic field and aiding in providing a desired shape and intensity of the magnetic field, said outer magnetic iron body providing a closed magnetic path for containing the magnetic field and increasing the intensity of the magnetic field at least around ten percent;

means mounting said inner body for adjustment relative to said outer body within a tolerance of around one mil thereby providing a magnetic field uniformity of at least around one part per million.

11. In apparatus for providing a magnetic field having a uniformity of at least around one part per million particularly adapted for use at magnetic intensities greater than the magnetic saturation of iron;

a unitary superconducting electromagnetic structure having a generally elongate inner cylindrical body defining a central bore and opposed ends;

a plurality of electrical coils positioned within said inner body about said central bore;

means to supply a predetermined electrical current to said coils with said coils being operable at superconducting temperatures;

an outer magnetic iron body extending about said inner elongate body between said ends, said outer magnetic iron body including a plurality of sections spaced circumferentially about said elongate body and extending between said ends for providing a closed magnetic path and shaping the magnetic field between the ends of the electromagnets;

a base support for said outer body; and means between said inner and outer bodies mounting said inner body for axial and radial adjustments relative to said outer body thereby to position said outer magnetic iron body relative to said coils within a precise tolerance.

12. In apparatus for providing a magnetic field having a uniformity of at least around one part per million particularly adapted for use at magnetic intensities greater than the magnetic saturation of iron;

a unitary superconducting electromagnetic structure having a generally elongate inner cylindrical body defining a central bore and opposed ends;

a plurality of electrical coils positioned within said inner body about said central bore;

means to supply a predetermined electrical current to said coils with said coils being operable at superconducting temperatures;

an outer magnetic iron body extending about said inner elongate body between said ends, said outer magnetic iron body including a plurality of sections spaced circumferentially about said elongate body and extending between said ends for providing a closed magnetic path and containing the magnetic field to aid in shaping the magnetic field between the ends of the electromagnets;

a base support for said outer body;

means between said inner and outer bodies mounting said inner body for axial and radial adjustments relative to said outer body thereby to position said outer magnetic iron body relative to said coils within a precise tolerance;

instrumentation means for preselected parameters for measuring the magnetic field generated by said electromagnetic structure; and a microcomputer for receiving the measurements of the preselected parameters and calculating the strength and uniformity of the magnetic field whereby the positioning of the outer magnetic iron body relative to said coils and magnetic field may be changed in response to said calculations for obtaining a maximum uniformity of the magnetic field.

13. In apparatus as set forth in claim 12; said outer magnetic iron body being positioned relative to said coils and magnetic field to provide an increase in the intensity of the magnetic field of at least around ten percent.

14. In apparatus as set forth in claim 12; said magnetic field having an intensity of around at least four Tesla.

15. In apparatus as set forth in claim 12; said microcomputer utilizing a computer program which includes accurate information concerning the mechanical, thermal, electrical, and magnetic properties of the materials used in the electromagnetic structure including particularly the materials used in the coils and the outer magnetic iron body.

16. In apparatus as set forth in claim 12; said mounting means between said inner and outer bodies comprises three adjusting means adjacent each end of said electromagnetic structure arranged at locations spaced circumferentially at one hundred twenty degrees with respect to each other, the locations adjacent one end of the electromagnetic structure being axially aligned with the locations adjacent the other end of said electromagnetic structure;

each of said adjusting means including adjusting screws for changing the axial and transverse spacings between said inner and outer bodies within a measured tolerance of around one mil.

17. In apparatus for providing a magnetic field having a uniformity of at least around one part per million and particularly adapted for use at magnetic intensities greater than the magnetic saturation of iron;

a unitary superconducting electromagnetic structure generally of a toroidal shape defining an inner elongate cylindrical body having opposed ends and a central bore therethrough;

at least two electrical coils positioned within said inner body about a circular path for utilizing different predetermined electrical currents;

an outer magnetic iron body extending about and secured to said inner elongate body between said opposed ends, said outer magnetic iron body including a plurality of longitudinally extending sections spaced circumferentially about said inner elongate body and extending between said opposed ends for providing a closed magnetic path and shaping the magnetic field between the ends of said body in a uniform manner for increasing the intensity of the magnetic field;

an annular end plate structure at each end of said iron body including a plurality of contiguous segments extending radially inwardly from said longitudinally extending sections alongside the ends of said inner body and positioned closely adjacent the ends of said inner body and the coils therein; and means electrically insulating said segments of each end plate structure from each other thereby to break up and reduce eddy currents at said end plate structure.

18. In apparatus for providing a magnetic field having a uniformity of at least around one part per million and particularly adapted for use at magnetic intensities greater than the magnetic saturation of iron;

a unitary superconducting electromagnetic structure generally of a toroidal shape defining an inner elongate cylindrical body having opposed ends and a central bore therethrough;

at least two electrical coils positioned within said body about a circular path for utilizing different predetermined electrical currents;

an outer magnetic iron body extending about and secured to said inner elongate body between said opposed ends, said outer magnetic body including a plurality of longitudinally extending sections spaced circumferentially about said elongate body and extending between said opposed ends for providing a closed magnetic path and shaping the magnetic field between the ends of said body in a uniform manner for increasing the intensity of the magnetic field;

an annular end plate structure at each end of said outer iron body including a plurality of contiguous segments extending radially inwardly from said longitudinally extending sections to form a continuous circular path;

means electrically insulating said segments of each end plate structure from each other thereby to break up and reduce eddy currents at said end plate structure;

means between said inner body and said outer body mounting said inner body for axial and radial adjustments relative to said outer body at three circumferentially spaced locations adjacent each end of said inner body, the mounting means at one end of said inner body being axially aligned with the mounting means adjacent the other end of said inner body, each of said mounting means including adjusting screws for changing the axial and transverse spacings between said inner body and said outer magnetic iron body within a precise measured tolerance;

means for cooling said electromagnet including cryogenic fluids;

instrumentation means for preselected parameters for measuring the magnetic field generated by said electromagnetic structure; and a microcomputer for receiving the mesurements of the preselected parameters and calculating the strength and uniformity of the magnetic field whereby the positioning of said inner body relative to said outer magnetic iron body may be changed in response to said calculations for obtaining maximum uniformity of the magnetic field.

19. In apparatus as set forth in claim 18; said outer magnetic iron body after being accurately positioned relative to said inner providing an increase in the intensity of the magnetic field of a least around ten percent.

20. A unitary superconducting electromagnetic structure having a magnetic field uniformity of at least around one part per million and particularly adapted for use at magnetic intensities greater than the magnetic saturation of iron;

an inner body having dimensions conforming generally to the magnetic field;

a first coil arranged in a pattern about the magnetic field and positioned generally symmetrically to said body;

a second coil arranged adjacent said first coil and positioned generally symmetrically to said body about the magnetic field, said coils being formed of superconducting wire wound about a core under a predetermined amount of tensioning within a tolerance of around one mil and adapted for utilization with different predetermined electrical currents;

an outer magnetic iron body extending about said inner body and said magnetic field and aiding in providing a desired shaped and intensity of the magnetic field, said magnetic iron structure providing a closed magnetic path for containing and redirecting the magnetic field for increasing the intensity of the magnetic field;

means for cooling said superconducting wire in said coils below its critical temperature thereby causing said wire to become superconducting;

means mounting said coils and said outer body in relation to each other so that the relative positioning of said outer magnetic iron body to said coils and said magnetic field may be adjusted within a precise tolerance of around one mil thereby providing the magnetic field uniformity of at least one part per million;

said superconducting electromagnetic structure being designed and constructed in accordance with the following steps:

first establishing the volume, shape and intensity of the desired magnetic field;

positioning said coils and outer magnetic iron body in relation to each other and to the magnetic field so that such positioning of the magnetic iron of the outer body obtains a maximum effect on the intensity and shape of the magnetic field;

utilizing a computer program which includes appropriate electromagnetic equations, appropriate engineering techniques for obtaining a precise positioning for the components of the electromagnetic structure including particularly the coils and the outer magnetic iron body, and accurate information concerning the mechanical, thermal, electrical, and magnetic properties of the materials used in the electromagnetic structure including particularly the materials used in the coils and outer magnetic iron body, the results and calculations obtained from the computer program being utilized for providing an engineering design;

manufacturing the superconducting electromagnetic structure based on said engineering design; and adjusting the position of the coils and outer magnetic iron body in relation to each other within a tolerance of around one mil for obtaining the desired shape and maximum intensity of the magnetic field with a magnetic field uniformity of greater than one part per million, each coil being formed by winding about a core while being tensioned a predetermined amount and positioned on the core within an accuracy of around one mil in all directions thereby to obtain a magnetic field uniformity of greater than one part per million.

* * * * *